United States Patent
Notthoff

(10) Patent No.: US 7,057,971 B2
(45) Date of Patent: Jun. 6, 2006

(54) SYSTEMS AND METHODS THAT EMPLOY INDUCTIVE CURRENT STEERING FOR DIGITAL LOGIC CIRCUITS

(75) Inventor: Johannes K. Notthoff, Vista, CA (US)

(73) Assignee: Northop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/766,429

(22) Filed: Jan. 28, 2004

(65) Prior Publication Data

US 2005/0162797 A1 Jul. 28, 2005

(51) Int. Cl.
*G11C 8/00* (2006.01)

(52) U.S. Cl. .................. 365/242; 365/233; 365/16; 327/374; 326/30

(58) Field of Classification Search ............... None
See application file for complete search history.

(56) References Cited

U.S. PATENT DOCUMENTS

| | | | | |
|---|---|---|---|---|
| 4,992,751 A | * | 2/1991 | Attwood et al. | 330/10 |
| 5,663,672 A | * | 9/1997 | Nuechterlein | 327/374 |
| 6,833,734 B1 | * | 12/2004 | Chan | 326/82 |
| 6,909,309 B1 | * | 6/2005 | Green | 326/115 |
| 2002/0057017 A1 | | 5/2002 | Chan | |

OTHER PUBLICATIONS

Lin Wu, et al.; A Low Jitter 1.25GHz CMOS Analog PLL for Clock Recovery; 0-7803-4455-3/98; IEEE, 1998.

G. Van Der Plas, et al.; Systematic Design of a 14-bit 150-MS/s CMOS Current-Steering D/A Converter; Department of Electrical Engineering, Katholieke Universiteit Leuven, ESAT-MICAS; Heverlee, Belgium.

International Search Report dated Nov. 27, 2005 mailed Dec. 28, 2005 for PCT Application Serial No. PCT/US05/00864, 7 pages.

* cited by examiner

*Primary Examiner*—David Lam
(74) *Attorney, Agent, or Firm*—Amin & Turocy, LLP

(57) ABSTRACT

The present invention provides systems and methods that utilize inductive current steering to improve logic circuit performance by mitigating propagation delays associated with conventional transistor current steering. The system and methods employ RF transformers, wherein energizing primary windings induce current in associated secondary windings. In one aspect, a single clock bus is employed to induce the current, which is routed via respective ends of the secondary winding to emitter leads of the transistors. This current and voltage is 180 degrees out-of-phase such that one transistor is "on" while the other is "off," which generates a differential output. In another aspect, a differential clock signal is employed to induce the current in secondary windings and associated transistor emitters. Further, the systems and methods can be utilized to construct flip-flops and shift registers by coupling differential transistor pairs and driving these pairs with the transformer-based single-ended or differential clock.

24 Claims, 11 Drawing Sheets

SYSTEMS AND METHODS THAT EMPLOY INDUCTIVE CURRENT STEERING FOR DIGITAL LOGIC CIRCUITS

TECHNICAL FIELD

The present invention generally relates to digital logic circuits, and, more particularly, to systems and methods that utilize inductive current to steer digital logic circuits.

BACKGROUND OF THE INVENTION

Current Mode Logic (CML), or Emitter-Coupled Logic (ECL) is commonly utilized in high-speed logic (e.g., bipolar digital) circuits. In general, CML/ECL is based on a simple differential amplifier, wherein a transistor(s) (e.g., BJT) is utilized to provide a current to a transistor pair of the differential amplifier. The current can be steered through the transistors by providing bias signals to the bases of the transistors, wherein one signal is utilized to turn an associated transistor "on" and the other signal is utilized to turn the other transistor "off." The current in the "on" transistor generates a voltage drop across a collector resistor, which can be accessed through an associated output terminal. Since current does not flow through the collector resistor in the "off" transistor, the potential at the associated output terminal is ground potential.

Reversing base signals alternates this effect. Thus, the transistor in the "on" state is switched "off" and the transistor in the "off" state is switched "on." It is understood that the terms "off" and "on" are not absolute; an "off" device can still pass a small amount of current and an "on" device can carry a large amount of current. A commonly used ratio of "on" current to "off" current in a differential transistor pair switch is in the range of 1000:1 to 10:1. As a consequence, current ceases to flow in one transistor, dropping the associated output voltage at the collector or drain to ground, and commences the flow of current in the other transistor, which generates a voltage drop across the associated collector or drain resistor and provides an output voltage at the associated output terminal. Thus, in this example, current can be steered through the transistors by selectively activating one transistor while deactivating the other transistor. The foregoing provides a means to selectively turn "on" one of the transistors to vary a differential output that can be utilized to drive various logic gates.

The aforementioned principles can be utilized to construct complex gates (e.g., AND, OR, XOR, XNOR, MUX, etc.), including data latches. For example, a data latch can be generated by coupling two differential transistor pairs, wherein one differential transistor pair can be utilized for "tracking" data and the other differential transistor pair can be utilized for "holding" data. By connecting data latches in series, a Data flip-flop (D flip-flop), can be generated. In many instances, the D flip-flop can employ edge triggering (e.g., rising edge triggering (e.g., 0-1 transition) or falling edge triggering (e.g., 1-0 transition)), wherein a rising/falling edge of a clock pulse can be utilized to "latch" data that is present on an input line of the D flip-flop. If the data on the input line changes state while the clock pulse is high/low, then the output follows the input.

Data flip-flops (DFFs) are commonly utilized as building blocks of many integrated circuits such as registers and frequency dividers. The speed of a D flip-flop, and thus many integrated circuits, depends at least in part on the switching time of the differential transistor pairs and the elements that steer the current into the differential transistor pairs. Commonly, the steering elements are differential transistor pairs that provide a clock signal, alternately turning on the "track" and "hold" differential pair. A critical parameter of the D flip-flop is the "clock to Q time," which is the time between the rising/falling edge of the clock signal to the rising/falling time of the signal at the collectors of the differential transistor pairs in a slave latch and its buffer, which generally follows the differential transistor pairs providing buffering to satisfy the required fanout. The reference edge typically is defined as the point in time wherein the differential signals cross and is also known as the common mode signal voltage.

In D flip-flops, where the differential transistor pairs in the latches carry the data, the clock differential transistor pairs are "stacked" in series with the latch differential transistor pairs. In this configuration, the clock signal switches the clock differential transistor pairs and then the data carrying differential transistor pairs. The summation of propagation delays in both differential transistor pairs is commonly referred to as the total "clock to Q" delay. This total "clock to Q" delay is a measure of performance; and, reducing either or both components (the clock differential transistor pair delay and/or the data differential transistor pair delay) of the total "clock to Q" delay can increase performance (e.g., speed).

As circuit frequency increases, transistor (e.g., a clocking transistor) gain typically decreases. At frequencies over 20 GHz, generally, it becomes difficult to drive transistors and fanout is limited. Conventionally, multiple clock drivers are utilized to drive transistors at high frequencies; however, this solution can be inefficient and increases power dissipation and design layout area.

SUMMARY OF THE INVENTION

The present invention relates to systems and methods that reduce total propagation delay, or "clock to Q" delay associated with electrical/electronical circuits that employ differential transistor pairs to steer current. The system and methods provide a novel approach wherein RF transformers are employed to steer current rather than clock differential transistor pairs. As a result, current steering clock differential transistor pairs can be eliminated from circuit design, which eliminates the associated propagation delay component from the total propagation delay ("clock to Q" delay), thereby improving circuit performance. Moreover, eliminating current steering clock differential transistor pairs alleviates the need to add multiple transistor-based clock drivers at high frequencies. As known, at high frequencies it becomes difficult to drive transistors and adding additional transistor-based clock drivers to overcome transistor gain limitations can render an inefficient solution that can increase dissipation and design layout size and complexity.

A RF transformer can be utilized to steer current by employing a primary winding of the transformer as a clock line and center-tapping a secondary winding of the transformer, wherein the center tap is connected to a current source, one end of the secondary winding is routed to the emitter of one differential transistor(s) and the other end of the secondary winding is routed to the emitter of the other differential transistor(s). The two ends of the secondary winding convey inductively coupled clock signals that are 180 degrees out of phase; and, thus, the current in one end of the secondary winding can be utilized to turn "on" a transistor(s) while the current in the other end of the secondary winding can be utilized to turn "off" a transistor(s). When a positive current ramp is present in the clock line, the emitter voltage in the first transistor rises, reducing its base-emitter voltage (VBE) and emitter current. The opposite occurs in the second transistor of the differential pair, the emitter voltage rises, VBE increases and the transistor turns on. As the current and voltage in the clock line reverses, the opposite occurs in both transistors and both transistors reverse.

Alternatively, a plurality of transformers can be employed, wherein respective secondary windings provide induced current to respective transistors and/or differential transistor pairs in order to selectively turn transistors (e.g., associated with track and hold circuits and latches) "on" and "off." The foregoing can be employed in connection with switching circuits, buffers, shift registers, flip-flops, dividers, multiplexers, demultiplexers and the like. Moreover, it is to be appreciated that in various aspects of the present invention, a clock differential transistor pair can be concurrently employed with transformer-based clocking technique described herein.

Conventional techniques focus on reducing, rather than eliminating, clock propagation delay. For example, in one technique the clock signal is reduced by dividing differential transistor pair current by a lower ratio (e.g., 9:1) than commonly utilized (e.g., 1000:1). In this technique, both transistors are always "on," to a varying degree, which reduces the "turn-on" time of the transistor in the "quasi-off" state. In another technique, a resistor is added to the emitter lead and a separate current source provides a "keep-alive" current through the "off" transistor. One consequence associated with this technique is decreased signal amplitude.

The foregoing techniques, as well as other conventional techniques, can reduce propagation delay associated with current steering clock differential transistor pairs; however, these techniques do not contemplate eliminating the current steering clock differential transistor pairs, and thus the associated delay, via utilizing RF transformers to steer current. In addition, conventional techniques typically add clock drivers at high frequencies to overcome transistor limitations. However, adding such clock transistors and/or buffers can be inefficient and increase dissipation and design layout size and complexity. Thus, the present invention provides a novel approach that affords various advantages and improvements over conventional systems.

In one aspect of the present invention, a single-clock switching device is illustrated. The system comprises a current steering component that provides a signal to a switching component. This signal is utilized to provide a differential signal at the output of the switching component by toggling the state of the switching component. The steering component comprises at least an inductive element, which can be utilized to generate a steering current upon receiving one or more pulses that energize a primary winding of an inductive element. This induces a current in a second winding associated with the inductive element 130. The inductive current is routed to the switching component where it can toggle the state of an associated differential transistor pair by modulating the emitter voltages of the pair. In one aspect of the present invention, this is achieved by center tapping the secondary winding, routing one end of the secondary winding to one of the transistors of the transistor pair, routing the other end of the secondary to the other transistor of the transistor pair, and coupling the center tap to a current source. It is noted that the inductive current and the resulting voltage in the ends of the secondary windings is typically 180 degrees out-of-phase such that the current in one of the ends activates a corresponding transistor while the current in the other end deactivates its corresponding transistor.

In another aspect of the present invention, a differential-clock switching device is illustrated. In this configuration, a clock/true and a clock/false input is utilized to drive the clock bus. The differential clock provides a signal that traverses through transformer primary windings, which induces a current in the transformer secondary windings. This current can be utilized that can toggle the state of transistors of a differential transistor pair, wherein the differential clock signal is utilized to turn one of the transistors "on" while turning the other transistor "off." The clock/true and clock/false signals can be pulled high and low to toggle transistor state from "on" to "off" or "off" to "on" and provide a differential signal at the output of the switching device.

In yet another aspect of the present invention, the novel features of the present invention are utilized to construct an inductive current steering-based flip-flop. The system comprises a plurality of data latches serially connected and driven by a similar transformer-based clock bus. In general, the transformer-based clock bus can include a one or more primary windings and associated secondary windings that provide an induced current that can steer track and/or hold differential transistor pairs associated with the data latches. The system can employ a differential clock bus, wherein a clock/true or a clock/false input can be pulled high or low to turn respective differential transistor pairs (e.g., track and hold) "on" or "off." Alternating the clock inputs by alternating which clock transistors are turned "on" or "off" enables the circuit to track and hold data.

In still other aspects of the present invention, a system is provided that can be employed as a shift register. The system comprises a plurality of flip-flops, wherein the outputs associated with one flip-flop are coupled to the inputs of a following flip-flop and a similar clock bus is extended to one or more of the flip-flops.

In other aspects of the present invention, methods are provided for single clock bus switching devices, differential clock bus switching devices, flip-flops and shift registers. Moreover, it is to be appreciated that the systems and methods of the present invention can be employed in connection with memory modules (e.g., X-bit, where X is an integer), D-type flip-flops (e.g.,), latches, multiplexer-drivers, voltage-controlled oscillators, fiber optic communication amplifiers and switches, high performance power amplifiers (e.g., for 3G wireless applications), RF integrated circuits, and ASIC Circuits, for example. In addition, various electrical/electronical entities such as resistor, capacitors, grounds, voltage controlled current sources, current controlled current sources, solid-state devices, and the like can be employed in connection with the present invention.

The following description and the annexed drawings set forth in detail certain illustrative aspects of the invention. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF INVENTION

Figure 1:
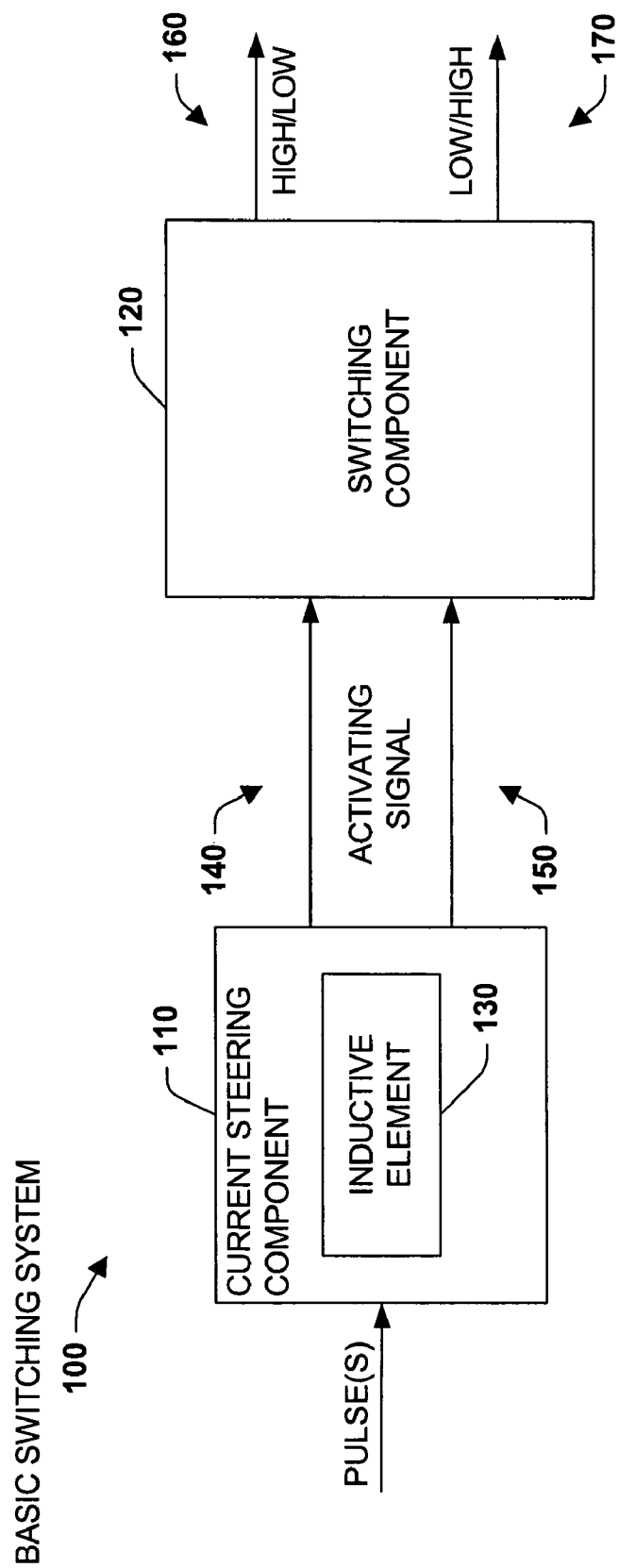
FIG. 1 illustrates an exemplary switching system that utilizes transformer-based current steering to activate and deactivate transistors in a differential transformer pair, in accordance with an aspect of the present invention.

The present invention provides systems and methods that improve integrated chip performance and mitigates propagation delays associated with current steering clock differential transistor and adding multiple transistor-based clock drivers for high frequency applications pairs by utilizing RF transformers instead of differential transistor pairs to steer current. In this approach, the primary winding(s) of an RF transformer(s) is utilized as a clock line and a secondary winding(s) is utilized to generate a inductive current(s) that toggles transistor state in respective transistors by routing the inductive signal to respective transistor emitter leads. In general, inductive current 180 degrees out of phase is generated in order to selectively turn transistors "on" and "off," and, thus, provide a differential output. The foregoing reduces total propagation delay ("clock to Q" delay) and mitigates adding multiple transistor-based clock drivers for high frequency applications by eliminating current steering clock differential transistor pairs. It is noted that there is a very small delay in the clock signal path due to the signal delay in the clock line itself, but this delay is generally negligible (in the order of 4 to 10 ps per mm, as compared to propagation delays in a HBT stage, which may be on the order of 10 to 20 ps. A typical clock line length in a high-speed DFF is about 0.1 mm).

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

FIG. 1 illustrates a system 100 that can be employed as a switching system, in accordance with an aspect of the present invention. The system 100 comprises a current steering component 110 that provides an input(s) to a switching component 120, wherein the input(s) is utilized to activate and/or deactivate one or more outputs associated with the switching component 120.

The steering component 110 comprises at least an inductive element 130, which can be utilized to generate a steering current(s). For example, the current steering component 110 can receive one or more pulses (e.g. square, saw, sinusoidal, etc.) that energize a first winding (not shown) of the inductive element 130. A second winding (not shown) of the inductive element 130 can reside proximate the first winding, wherein energizing the first winding induces a current in the second winding. The induced current can be routed to one or more inputs of the switching component 120.

It is to be appreciated that the output of the inductive element 130 can be utilized to toggle the state at the output of the switching component 120. For example, in one aspect of the present invention, the second winding of the inductive element 130 can be center tapped wherein one end of the second winding provides an output 140 and another end of the second winding provides an output 150, wherein the outputs 140 and 150 can be 180 degrees out-of-phase. When a pulse is received by the inductive element 130, a current can be induced in the second winding such that one of the outputs 140 and 150 can provide an activating signal to the switching component 120 while the other output 150 or 140 can provide a deactivating signal to the switching component 120.

When an opposing pulse is received, a current can be induced in the second winding that reverses the state of the switching component 120. For example, the second winding can generate an activating signal for the inactive output and a deactivating signal for the active output. As describe in detail below, the state of the switching component 120 is determined, at least in part, by the outputs 140 and 150. Thus, as the activating signal generated by the inductive element 130 is toggled between outputs 140 and 150 of current steering component 110, state is toggled between outputs 160 and 170 of the switching component 120. In addition, it is noted that the outputs 140 and 150 can be differential signals, in accordance with aspects of the present invention.

It is to be appreciated that the switching component 120 can comprise a plurality of transistors such as bipolar transistors including Indium Phosphide (InP), carbon-doped InP, Indium Gallium Arsenide (InGaAs), GaAs, and/or Aluminum Gallium Arsenide (AlGaAs) heterojunction bipolar transistors (HBTs) (e.g., single HBTs (SHBTs) and double HBTs (DHBTs)). Such transistors can be utilized in a differential pair or similar configuration. In addition, the outputs 160 and 170 of the switching component 120 typically are associated with the collectors of such transistors, and the signal at the outputs 140 and 150 of the current steering component 110 typically are provided to emitters associated with such transistors.

Furthermore, it is to be appreciated that the system 100 can be employed in connection with X-bit registers (where X is an integer), frequency dividers, X-bit memory modules (where X is an integer), flip-flops (e.g., D, RS, JK, etc.), latches, multiplexers, voltage-controlled oscillators, fiber optic communication, high performance power amplifiers, RF integrated circuits, ASIC Circuits, and the like, for example. Moreover, it is to be appreciated that the current steering component 110, the switching component 120 and/or the inductive element 130 can include various electrical/electronical entities such as resistor, capacitors, grounds, voltage controlled current sources, current controlled current sources, solid-state devices, and the like.

It is to be appreciate that the system 100, as well as the other system and methods described herein, can reduce integrated circuit total propagation delay ("clock to Q" delay) associated with clock differential transistor pairs via utilizing a RF transformer-based clock to steer current rather than a conventional clock differential transistor pair. In addition, it is to be appreciated that in various aspects of the present invention, a clock differential transistor pair can be concurrently employed with transformer-based clocking technique described herein. Moreover, the systems and methods mitigate a need to add multiple transistor-based clock drivers at high frequencies (e.g., >20 GHz) to overcome transistor gain limitation. The foregoing provides an improvement since adding transistor-based clock drivers can decrease circuit efficiency and increase dissipation and design layout.

Figure 2:
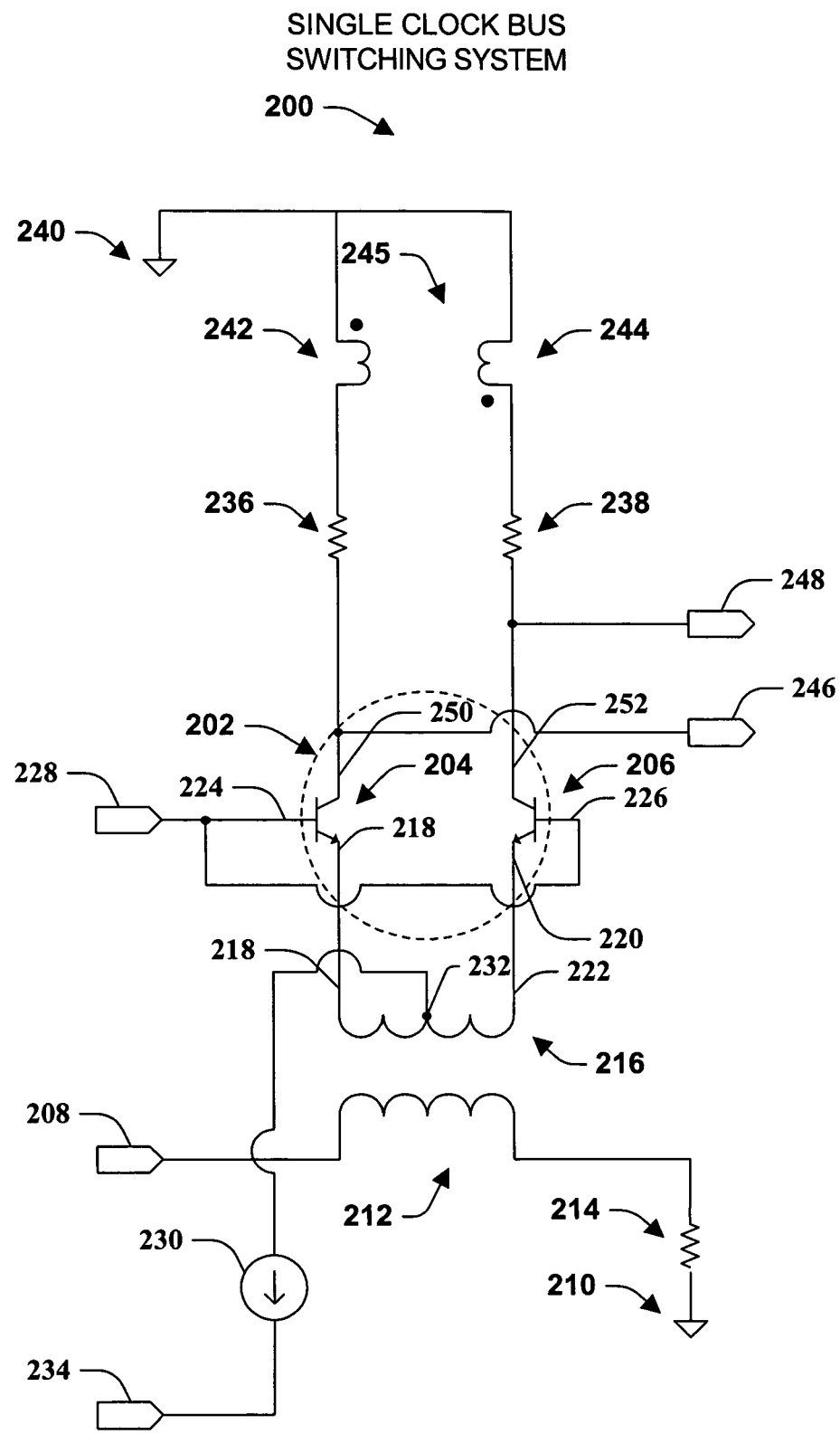
FIG. 2 illustrates an exemplary single clock bus switching circuit that utilizes a center-tapped secondary transformer winding to route induced current to a differential transformer pair, in accordance with an aspect of the present invention.

FIG. 2 illustrates a system 200 that can be employed as a basic single clock bus switching device 200 (e.g., the system 100 described supra), in accordance with an aspect of the present invention. The system 200 comprises a differential transistor pair 202 with a transistor 204 and a transistor 206. As depicted, the differential transistor pair 202 can be driven by a clock input 208, which can be, for example, a single clock bus. The clock input 208 can form a path to ground 210 through a primary winding 212 and a resistor 214. The primary winding 212 can be employed to induce a current in a secondary winding 216. The secondary winding 216 can be center-tapped, wherein a first end 218 of the winding 216 can be coupled to the emitter lead 218 of the transistor 204 and a second end 220 of the winding 216 can be coupled to the emitter lead 222 of the transistor 206.

A base 224 of the transistor 204 and a base 226 of the transistor 206 can be coupled to a voltage source 228 that can provide a suitable bias voltage. A current source 230 can be utilized to couple a center-tap 232 of the secondary winding 216 with a voltage source 234. The current source 230 can be utilized to regulate a current to the center-tap 232. A resistor 236 and a resistor 238 can be utilized to couple the transistor 204 and the transistor 206, respectively, to a ground 240 through a winding 242 and a winding 244 of a transformer 245. Differential outputs 246 and 248 can be obtained from a collector lead 250 associated with the transistor 204 and a collector lead 252 associated with the transistor 206, respectively.

As noted above, the system 200 can be driven by the clock input 208. For example, a signal can be transmitted to the input 208 where it is conveyed through the winding 212, which can induce a current in winding 216. Depending on the signal (e.g., amplitude, polarity, phase, etc.), the induced current can generate an activating signal in either winding end 218 or winding end 222. The activating signal can turn "on" the associated transistor, wherein the other transistor is turned "off." The foregoing enables current to flow in the collector of the "on" transistor and mitigate current flow in the "off" transistor, which provides a differential signal at the outputs 246 and 248.

In a particular example, the following element values can be utilized: the windings 242 and 244 can be about 20 microns in length, the windings are arranged in opposite polarity; resistor 236 can be about 33 ohms; resistor 238 can be about 33 ohms; the bias voltage 228 can be about −0.7 volts (for a InP HBT or Si BJT); the windings 216 and 212 can be about 130 microns long; the current source 230 can be about 5 milliamperes; and voltage source 234 can be about −2.5 to −3.3 volts. The primary 212 can be utilized as a clock, for example, with speeds from 20 GHz to 125 GHz. At 125 GHz, the delay time between the clock differential signals and signals at the outputs 246 and 248 can be about 2.5 picoseconds. In addition, the system 200 can perform over about one octave, for example, from 25 GHz to 50 GHz, with similar value components. Moreover, the switched emitter current ratio (e.g., current through resistor 236/current through resistor 238) can range from about 2:1 to 6:1, for example.

Figure 3:
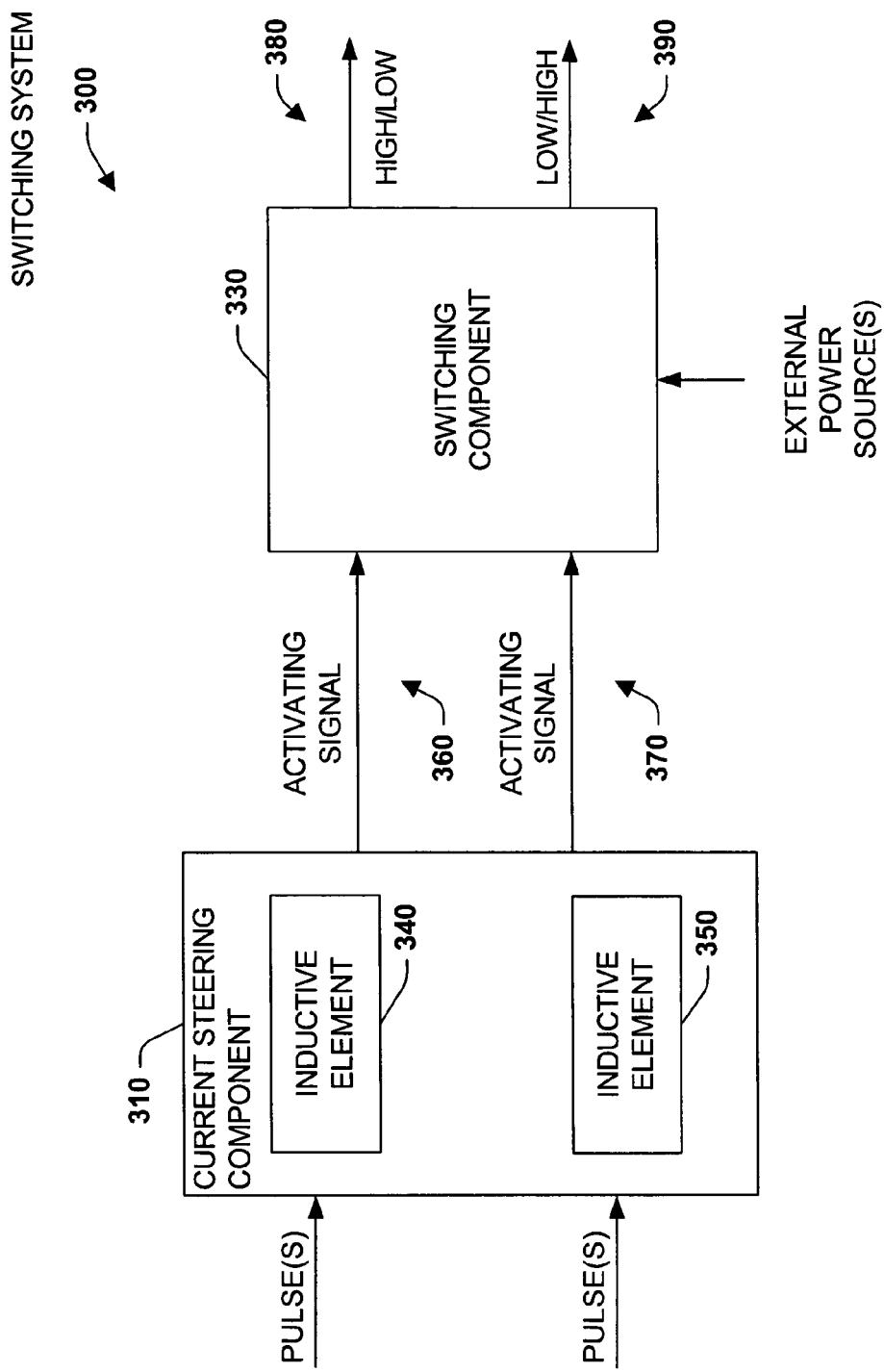
FIG. 3 illustrates an exemplary multi winding switching system to route induced current to respective transistors of a differential transformer pair, in accordance with an aspect of the present invention.

FIG. 3 illustrates a system 300 that can be employed as a switching system, in accordance with an aspect of the present invention. The system 300 can be similar to the system 100; however, the system 300 employs an inductive current steering component 310 with more than one transformer, wherein respective transformers generate steering currents that can be utilized as inputs to a switching component 330. These inputs can be utilized to facilitate setting the state of the switching component 330, and hence, one or more outputs associated with the switching component 330.

The steering component 310 can comprise at least two inductive components 340 and 350 that can be utilized to generate and provide inductive current to the switching component 330. For example, one or more clock pulses can be received by the steering component 310, wherein the pulses can energize a primary winding (not shown) associated with the inductive component 340 and a primary winding (not shown) associated with the inductive component 350. Energizing the primary windings can induce currents in respective secondary windings (not shOwn). The pulses provided to the steering component 310 can be configured to emulate a differential clock input As such, the current steering component 310 can be utilized to provide inputs to the switching component 330

Similar to the switching component 120, the switching component 330 can comprise a plurality of transistors, including Indium Phosphide (InP), carbon-doped InP, Indium Gallium Arsenide (InGaAs), GaAs, and/or Aluminum Gallium Arsenide (AlGaAs) heterojunction bipolar transistors (HBTs) (e.g., single HBTs (SHBTs) and double HBTs (DHBTs), as well as SiGe HBTs, JFETs or IGFETs. In addition, these transistors can be employed as differential pair and/or other configurations. Futhermore, the current steering component 310 can be utilized to generate inputs for the switching component 330. Thus, a signal 360 and a signal 370 generated by the current steering component 310 can be utilized as inputs to the switching component 330. Typically, these inputs are phase shifted (e.g., 180 degrees) and can be utilized to toggle the state of the plurality of transistors configured as differential pairs to provide a switched differential output.

By way of example, a pulse train can be provided to the inductive element 340 via of the current steering component 310 that generates a signal 360 that activates a transistor(s) from a differential transistor pair of the switching component 330. Concurrently, a 180-degree phase shifted signal can be provided to the inductive element 350 via of the current steering component 310 that generates a signal 370 that deactivates the other transistor of the differential transistor pair of the switching component 330. The collectors of the respective transistors from the differential transistor pair of the switching component 330 can be utilized to provide an output 380 and an output 390, wherein a combination of the outputs 380 and 390 provide a differential output for the switching component 330.

It is to be appreciated that the system 300 can be employed in connection with X-bit registers (where X is an integer), frequency dividers, X-bit memory modules (where X is an integer), flip-flops (e.g., D, RS, JK, etc.), latches, multiplexers, voltage-controlled oscillators, fiber optic communication, high performance power amplifiers, RF integrated circuits, ASIC Circuits, and the like, for example. Moreover, it is to be appreciated that the current steering component 110, the switching component 120 and/or the inductive element 130 can include various electrical/electronical entities such as resistor, capacitors, grounds, voltage controlled current sources, current controlled current sources, solid-state devices, and the like.

Moreover, it is noted that the systems 100 and 300 provide two examples in accordance with an aspect of the present invention. These examples are provided for brevity and explanatory purposes. It is to be appreciated that various other configurations can be employed in accordance with an aspect of the present invention. For example, virtually any number of current steering components can be employed. In addition, respective current steering components can include essentially any number of inductive elements and/or transistor-based current steering components. Furthermore, the switching components can comprise more or less inputs and/or outputs and/or include more or less transistors. Moreover, various combinations of the systems 100 and 300 can be concurrently employed with one or more switching components.

Figure 4:
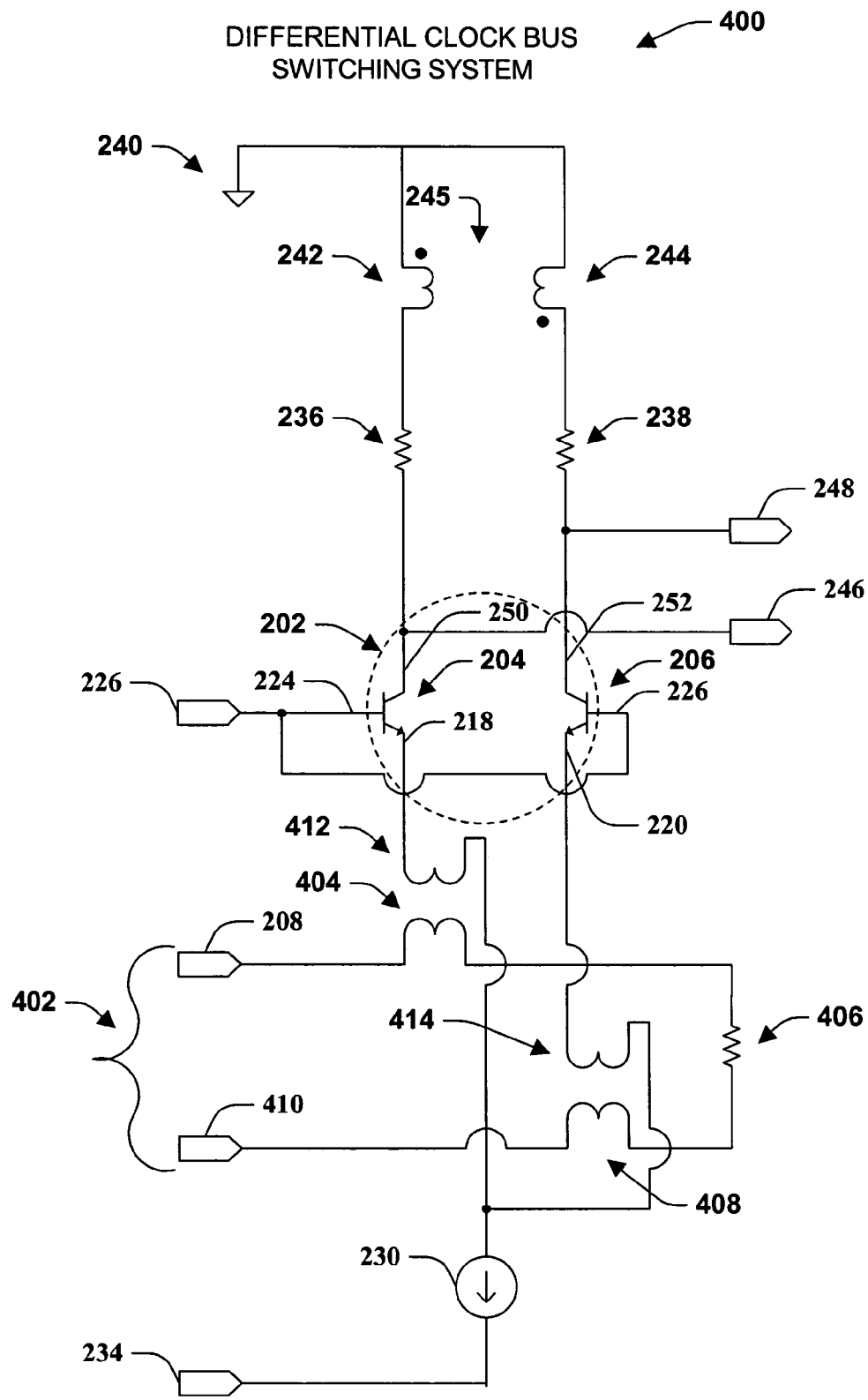
FIG. 4 illustrates an exemplary differential transformer-based clock bus switching circuit that toggles transistor state of transistors of a differential transformer pair, in accordance with an aspect of the present invention.

FIG. 4 illustrates a system 400 that can be employed as a differential clock bus switching device (e.g., the system 300 described supra), in accordance with an aspect of the preseut invention. The system 400 is similar to the system 200, except that it utilizes a differential clock signal 402 rather than a single clock signal to drive the transistors pair 202. The differential clock signal 402 provides a signal that traverses through the input 208, a primary winding 404, a resistor 406, a primary winding 408 and the input 410.

The signal typically energizes the windings 404 and 408 in an out-of-phase manner (e.g., an opposite polarity) such that one of a secondary winding 412 associated with the primary Winding 404 or a secondary winding 414 associated with the primary winding 408 is induced with a current that can turn "on" its associated transistor 204 or 206. The input signal can switch states such that the active transistor becomes inactive and the in active transistor becomes active. The foregoing configuration provides for switching differential outputs at outputs 246 and 248 that can be employed as inputs, for example, to various logic gates including AND, OR, XOR, NOR, MUX, and the like.

It is to be appreciated that the clock signal at the input 208 can be referred to as a "true" clock signal, whereas the clock signal at the input 410 can be referred to as a "false" clock signal. In addition, the secondary windings 414 and 412 can be constructed from metal 1 traces, the primary windings 404 and 408 can be constructed from a metal 2 air bridge residing proxfrnate the metal 1 traces.

Figure 5:
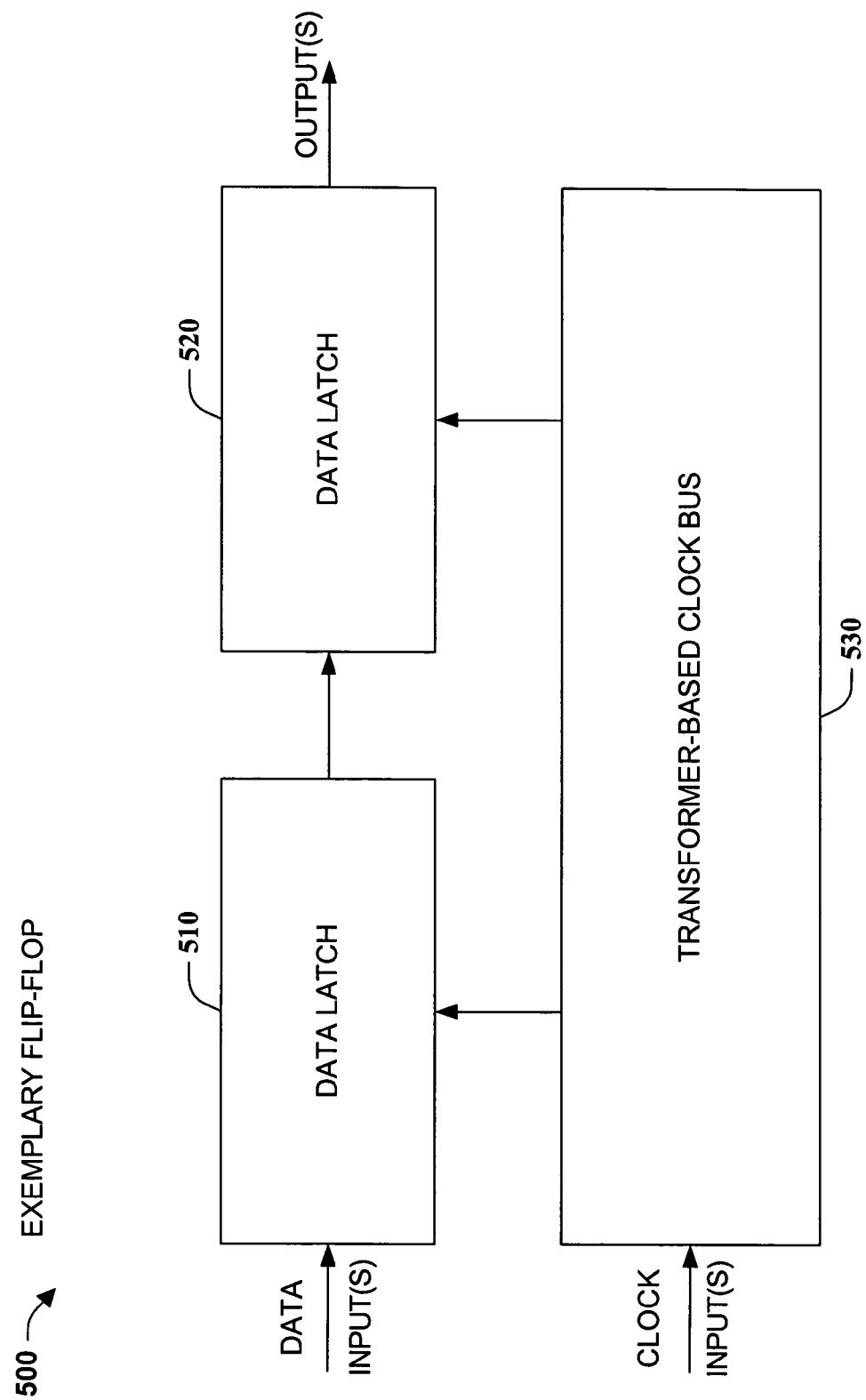
FIG. 5 illustrates an exemplary inductive current steering system that can be employed to construct digital logic circuits, in accordance with an aspect of the present invention.

FIG. 5 illustrates an exemplary system 500 that can be employed as a flip-flop, in accordance with an aspect of the present invention. The system 500 comprises a plurality of data latches 510 and 520 connected in series and driven by a transformer-based clock bus 530. In general, the transformer-based clock bus 530 can include a one or more primary windings (not shown) and associated secondary windings (not shown), for example, one set of primary/secondary windings for each data latch, that can provide an induced current that can steer track and/or hold differential transistor pairs (not shown) associated with the data latches 510 and 520.

In one aspect of the present invention, a clock/true or a clock/false input can be pulled high and provided to the transformer-based clock bus 530 in order to turn differential transistor pairs (e.g., track and hold) associated with the data latches "on" and/or "off." When the other clock input (clock/false or clock/true) is pulled high, the transformer-based clock bus 530 toggles the state (e.g., "off"/"on.") of the differential transistor pairs. Thus, by alternating which clock input is pulled high, the system 500 can track and hold data. It is to be appreciated that the system 500 can be configured as a divide-by-two circuit, as described in detail below. In addition, by utilizing inductive peaking, collector transition times can be shortened and amplitude increased. Furthermore, it is to be appreciated the system 500 can comprise virtually any number of latches. As depicted, two such latches are provided; however, the example is provided for brevity and explanatory purposes and does not limit the invention.

Figure 6:
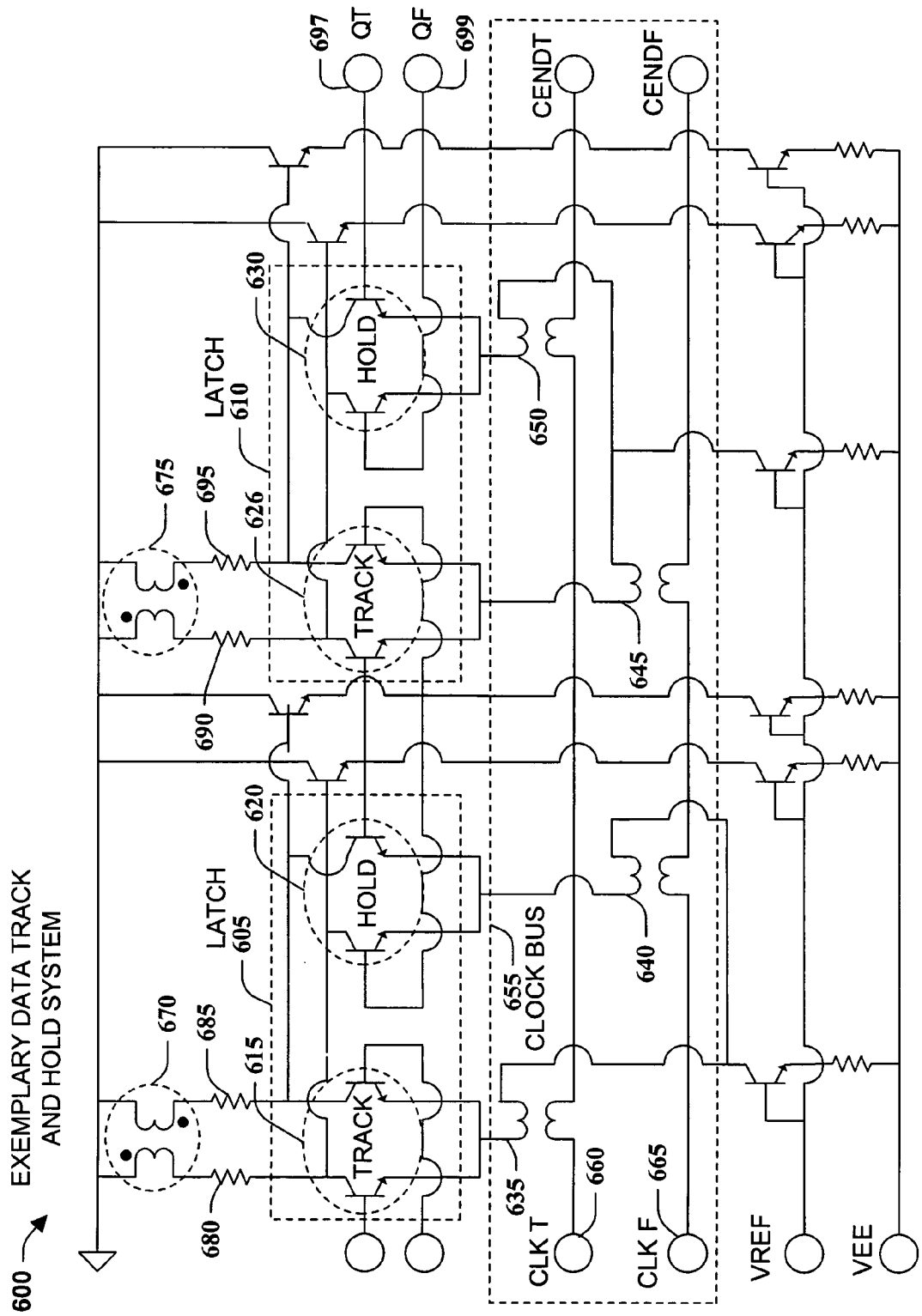
FIG. 6 illustrates an exemplary schematic of a system that employs a plurality of inductive current steering based latches to form a D flip-flop, in accordance with an aspect of the present invention.

FIG. 6 illustrates an exemplary system 600 that can be employed as a D flip-flop, in accordance with an aspect of the present invention. The system 600 comprises a data latch 605 and a data latch 610. As depicted, the data latches 605 and 610 can be coupled in a series manner. Conventional systems typically employ a clock transistor to steer current in flip-flops. However, utilizing a clock transistor can increase a system's propagation delay. This delay is mitigated in the system 600 via employing inductive current steering. It is noted that in various aspects of the present invention, it can be advantageous to utilize both the novel transformer-based clock technique described herein and the conventional transistor-based clock technique.

Thus, in accordance with an aspect of the present invention, transformer induced current is utilized to steer a track differential transistor pair 615 and a hold differential transistor pair 620 associated with latch 605 and/or a track differential transistor pair 625 and a hold differential transistor pair 630 associated with latch 610. This induced current is generated via a secondary winding 635, a secondary winding 640, a secondary winding 645 and a secondary winding 650, respectively, of a clock bus 655.

In one instance, a clock/true signal input 660 is pulled high. The result of this condition is the track differential transistor pair 615 in the latch 605 (e.g., "master" latch) is turned "off" and the hold differential transistor pair 620 in the latch 605 and the track differential transistor pair 626 in the latch 610 (e.g., "slave" latch) are turned "on." In another instance, a clock/false signal input 665 is pulled high. This results in the clock/true signal input 655 going low and a reversal of latch transistor pair state.

The system 600 further comprises an RF transformer 670 and an RF transformer 675 that can be are employed in series with a collector load resistors 680–685 and 690–695, respectively, in order to provide inductive peaking, which can improve collector waveforms obtained from the differential transistor pairs 615–620. This technique can be employed to extend the frequency range of the system 600.

The system 600, as depicted, can be configured as a divide-by-two circuit, wherein an inverted output QT 697 and an inverted output QF 699 can be utilized as data input, or a clock frequency divide-by-two. In general, as long as a clock-to-Q delay (Tc-q) plus a set-up time (Tsu) does not exceed one-half of a clock period, this division can be achieved (e.g., when fclock=50 GHz and Tc-q+Tsu is less than or equal to 10 picoseconds). It is to be appreciated that by adjusting the inductive peaking amplitude generated by transformers 670 and 675, for example, by reducing collector load resistance value, collector transition times can be shortened and amplitude increased, at the expense of reduced bandwidth. A typical bandwidth utilized for the system 600 is about ½ octave.

Figure 7:
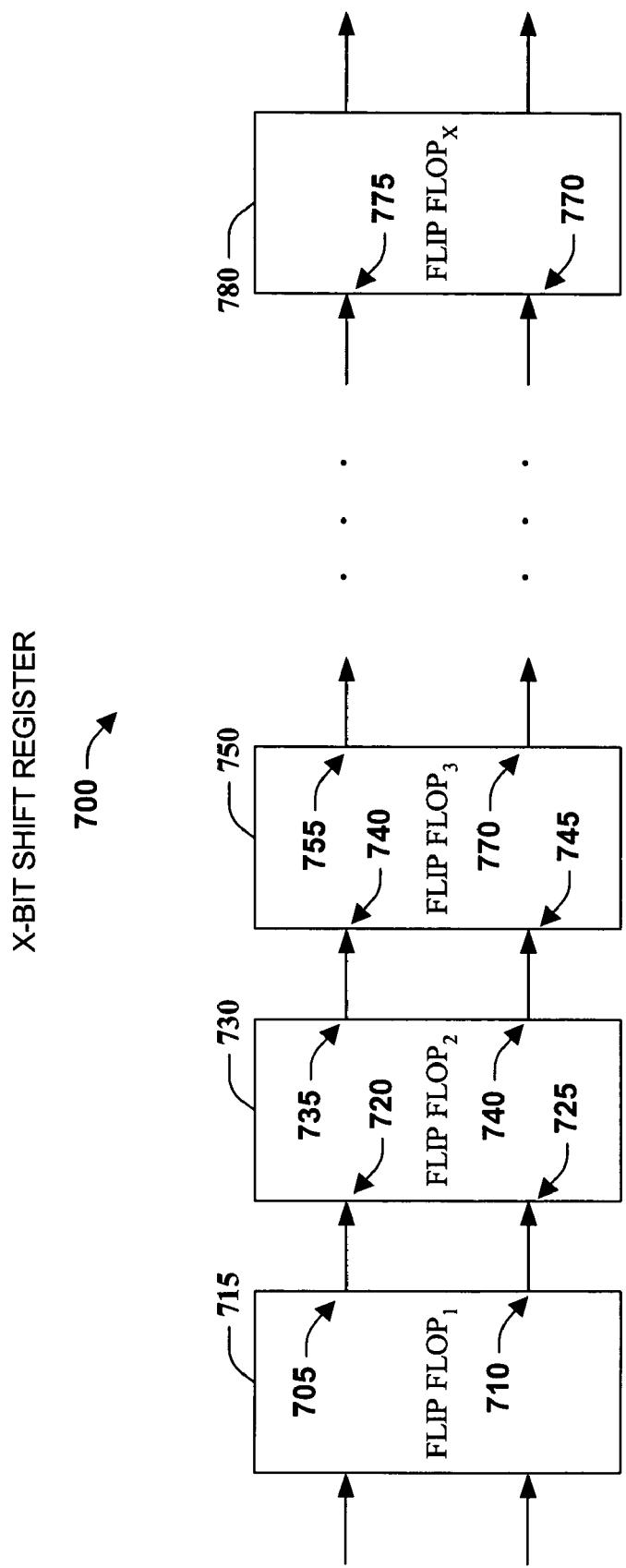
FIG. 7 illustrates an exemplary X-bit shift register formed by coupling one or more a plurality of inductive current steering based flip-flop, in accordance with an aspect of the present invention.

It is to be appreciated that the system 600 can be employed as a 4-bit shift register, in accordance with an aspect of the present invention. In addition, a plurality of systems similar to the system 600 can be coupled to construct an X-bit (e.g., 8-bit, 12-bit, etc.) shift register, where X is an integer, in accordance with an aspect of the present invention. For example, outputs associated with one flip-flop can be coupled to inputs of a following flip-flop connected in series and the same or similar clock bus can be extended to one or more of the flip-flops. This is illustrated in a system 700 of FIG. 7, wherein outputs 705 and 710 of a flip-flop 715 are coupled to inputs 720 and 725 of a flip-flop 730; the outputs 730 and 735 of the flip-flop 730 are coupled to inputs 740 and 745 of a flip-flop 750; the outputs 755 and 770 of the flip-flop 750 are coupled to inputs . . . of a flip flop . . . and outputs . . . of a flip-flop . . . are coupled to inputs 770 and 775 of a flip-flop 780. The end of the clock bus can terminated via a resistor, for example. In addition, it is noted that the last flip-flop 780 can be loaded with a "fanout" of one (e.g., a differential transistor pair at 5 mA.).

Figure 8:
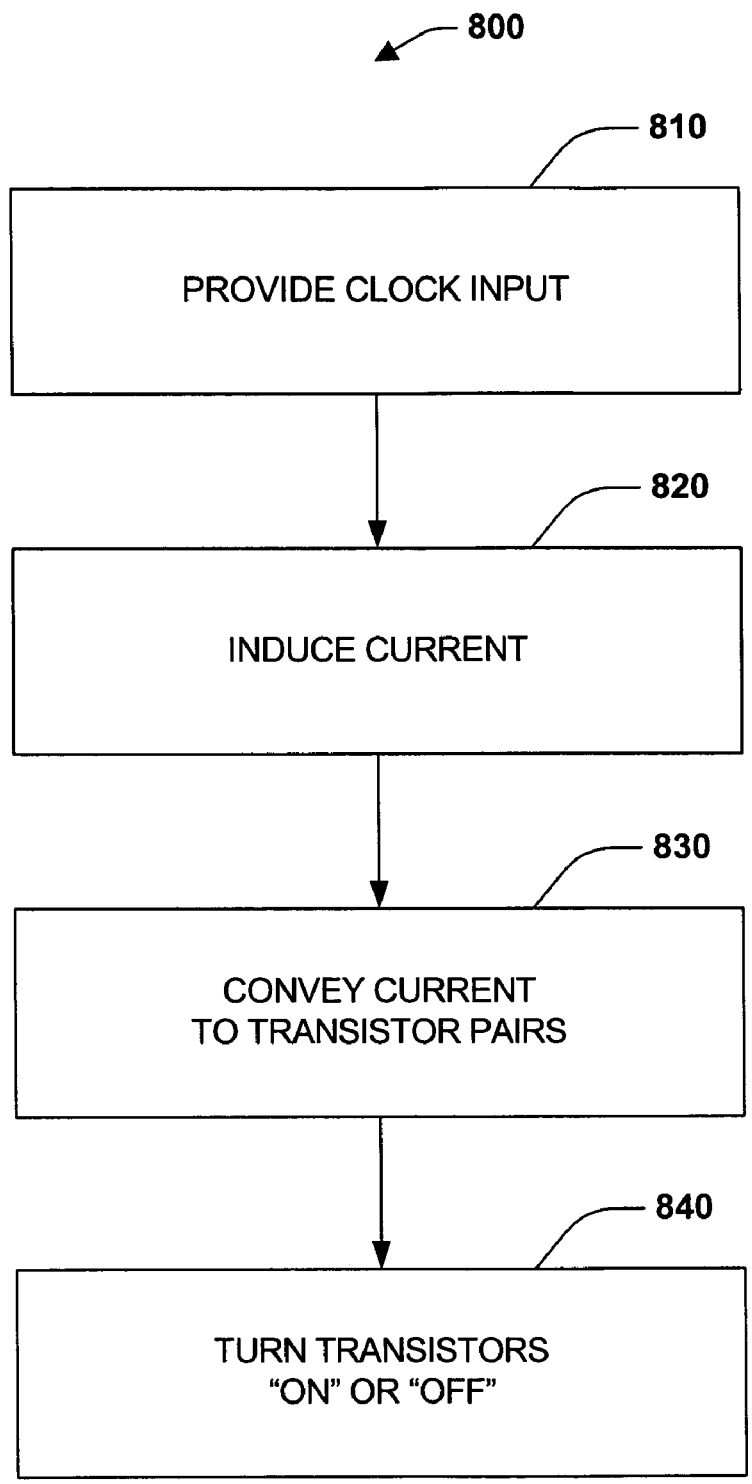
FIG. 8 illustrates an exemplary methodology for single clock inductive current steering switching circuitry, in accordance with an aspect of the present invention.
Figure 9:
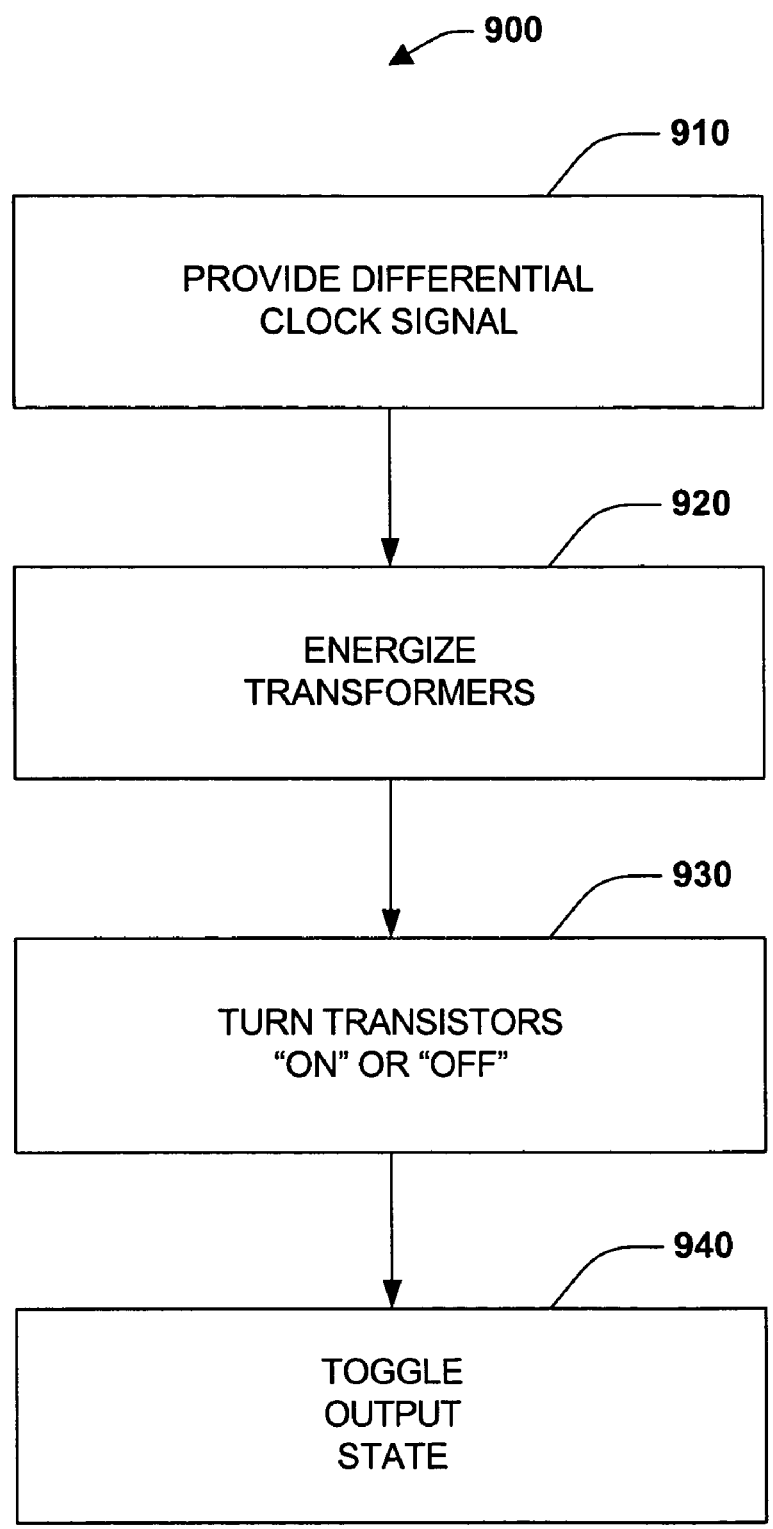
FIG. 9 illustrates an exemplary methodology for a differential clock based inductive current steering switching device, in accordance with an aspect of the present invention.
Figure 10:
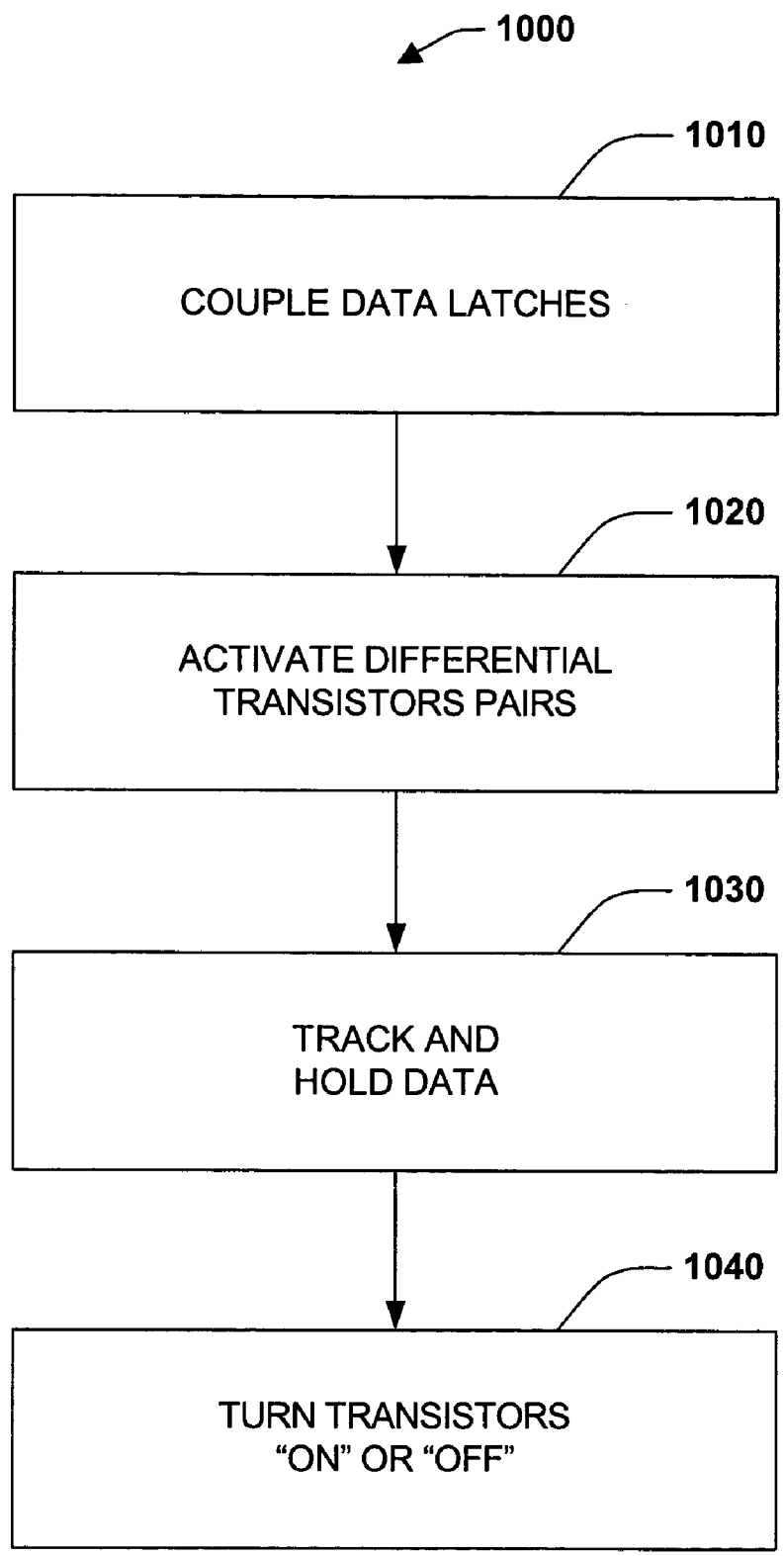
FIG. 10 illustrates an exemplary methodology that utilizes inductive current steering in connection with a flip-flop, in accordance with an aspect of the present invention.

FIGS. 8–10 illustrate methodologies, in accordance with an aspect of the present invention. While, for purposes of simplicity of explanation, the methodologies may be shown and described as a series of acts, it is to be understood and appreciated that the present invention is not limited by the order of acts, as some acts may, in accordance with the present invention, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the present invention.

Proceeding to FIG. 8, a methodology 800 for employing inductive current steering in connection with switching circuitry is illustrated in accordance with an aspect of the present invention. At reference numeral 810, a clock input is provided to a transformer-based bus. The clock input can include one or more pulses (e.g. square, saw, sinusoidal, etc.) that can energize a primary winding of a transformer associated with the transformer-based bus. At 820, a current can be induced in a secondary winding of the transformer associated with the transformer-based bus. It is to be appreciated that the secondary winding can be centered-tapped, wherein one end of the secondary winding is coupled to a first transistor of a differential transistor pair, the other end of the secondary winding is coupled to a second transistor of the differential transistor pair, and the center tap is coupled to a current source. In addition, the current in the two ends of the secondary winding typically are 180 degrees out-of-phase.

In this configuration, the induced current can be conveyed at 830 to a respective transistor to create a voltage difference at the emitters of the differential pair, which causes the respective transistors "on" or "off." The one or more pulses of the clock input can be further utilized to change the state of the transistors of the differential transistor pair such that the transistor in the "on" state is turned "off" and the transistor in the "off" state is turned "on." Thus, the pulses in connection with the transformer can toggle the state of the transistors, which toggles the state of the output of the transistors to provide a differential output signal. For example, the current in the "on" transistor can generate a voltage drop across a collector resistor, which can be obtained from a collector lead, or the associated output terminal. The potential associated with "off" transistor is approximately ground potential and can be obtained at the associated collector lead or output terminal.

It is to be appreciated that the methodology 800 can comprise a plurality of transistors such as bipolar transistors including Indium Phosphide (InP), carbon-doped InP, Indium Gallium Arsenide (InGaAs), GaAs, and/or Aluminum Gallium Arsenide (AlGaAs) heterojunction bipolar transistors (HBTs) (e.g., single HBTs (SHBTs) and double HBTs (DHBTs)). Such transistors typically are utilized as differential pairs, however, it is to be appreciate that other configurations can be employed in accordance with aspects of the present invention. Further, it is noted that the method 800 can be employed in connection with registers, frequency dividers, memory modules (e.g., X-bit, where X is an integer), flip-flops (e.g., D, RS, JK, etc.), latches, multiplexers, voltage-controlled oscillators, fiber optic communication, high performance power amplifiers, RF integrated circuits, and ASIC Circuits, for example. Moreover, it is to be appreciated that the method 800 can be employed in connection with various electrical/electronical entities such as resistor, capacitors, grounds, voltage controlled current sources, current controlled current sources, solid-state devices, and the like can be employed in accordance with aspects of the present invention.

FIG. 9 illustrates a methodology 900 that employs inductive current steering switching device, in accordance with an aspect of the present invention. At reference numeral 910, differential clock signals are utilized to provide differential signals to at least two inputs of a clock bus. It is noted that these signals can be referred to as a clock/true and a clock/false input.

At reference numeral 920, differential signals traverse primary transformer windings associated with respective transistors of a differential transistor pair. Typically, the circuit is configured such that the current induced in respective secondary windings is 180 degrees out-of-phase, which provides for activating one of the transistors of the differential transistor pair, while deactivating the other transistor. The input signal can additionally be utilized to reverse the induced current phase to activate the deactivated transistor and deactivate the activated transistor. The foregoing provides for toggling transistor state to turn respective transistors "on" or "off," which toggles the state of the transistors to provide a differential output signal.

Similar to the methodology 800, methodology 900 can comprise a plurality of transistors such as bipolar transistors including Indium Phosphide (InP), carbon-doped InP, Indium Gallium Arsenide (InGaAs), GaAs, and/or Aluminum Gallium Arsenide (AlGaAs) heterojunction bipolar transistors (HBTs) (e.g., single HBTs (SHBTs) and double HBTs (DHBTs) or FETs that can be generally are utilized as differential pairs, but can be employed in other configurations in accordance with aspects of the present invention. In addition, the method 900 can be employed in connection with registers, frequency dividers, memory modules (e.g., X-bit, where X is an integer), flip-flops (e.g., D, RS, JK, etc.), latches, multiplexers, voltage-controlled oscillators, fiber optic communication, high performance power amplifiers, RF integrated circuits, and ASIC Circuits, for example. Moreover, the method 900 can be employed in connection with various electrical/electronical entities such as resistor, capacitors, grounds, voltage controlled current sources, current controlled current sources, solid-state devices, and the like can be employed in accordance with aspects of the present invention.

FIG. 10 illustrates a methodology 1000 that utilizes an inductive current steering technique in connection with a D flip-flop, in accordance with an aspect of the present invention. At reference numeral 1010, data latches are serially coupled. A transformer-based clock bus is then utilized to energize one or more primary windings of the transformer, which induces current in associated secondary windings. At 1020, the induced current is utilized to turn track and/or hold differential transistor pairs associated with the data latches "on" and "off." In general, when a clock/true or a clock/false input that is pulled high is provided, various transistors are either activated or deactivated. When the other clock input is pulled high, the state of respective transistors is toggled such that transistors that were "off" are turned on and transistors that were "on" are turned "off." At 1030, the clock input is toggled to provide for tracking and holding data via the latches.

It is to be appreciated that the methodology 1000 can be employed within a divide-by-two circuit, wherein as inverted outputs can be utilized as data input, or a clock frequency divide-by-two. In addition, by adjusting the inductive peaking amplitude (e.g., by reducing collector load resistance value), collector transition times can be shortened and amplitude increased. Moreover, the methodology 1000 can be employed in connection with an X-bit shift register, where X is an integer, in accordance with an aspect of the present invention. For example, flip-flop outputs can be coupled to flip-flop inputs and a similar clock bus can be utilized with the flip-flops.

Figure 11:
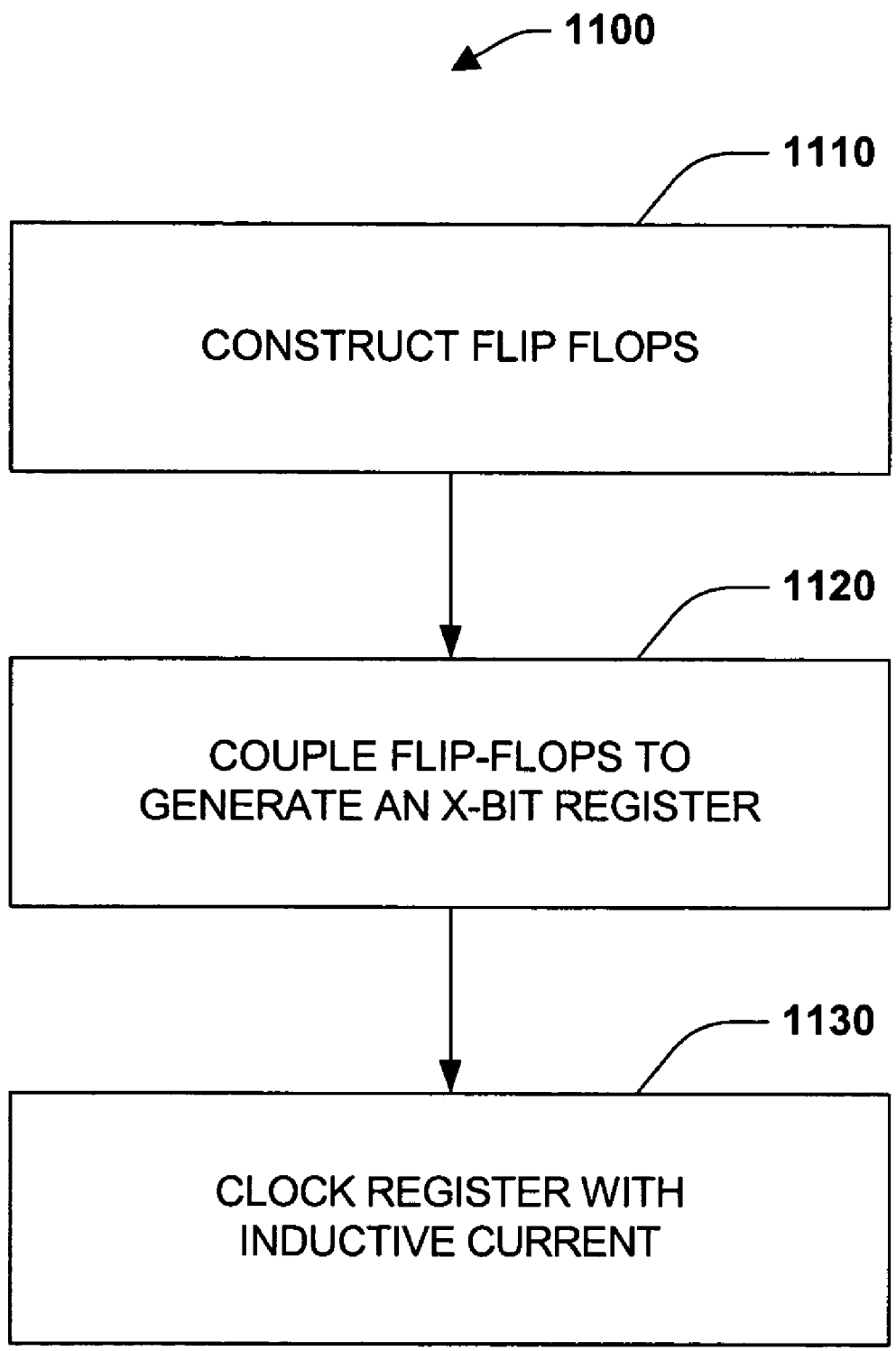
FIG. 11 illustrates an exemplary methodology can be utilized to construct an X-bit register, in accordance with an aspect of the present invention.

FIG. 11 illustrates a methodology 1100 that can be utilized to construct an X-bit register, in accordance with an aspect of the present invention. At reference numeral 1110, data latches are serially coupled to form a plurality of flip-flops, as described above. At 1120, X (where X is an integer) flip-flops are coupled via routing the outputs associated with one flip-flop to the inputs of a following flip-flop. As many flip-flops as necessary can be coupled in this manner to provide a register with a desired number of bits. At 1130, a transformer-based clock bus can be utilized to drive the X-bit register. It is noted that the clock bus can be terminated via a resistor, for example. In addition, the last flip-flop can be loaded with a "fanout" of one (e.g., a differential transistor pair at 5 mA.).

What has been described above includes examples of the present invention. It is, of course, not possible to describe every conceivable combination of components or methodologies for purposes of describing the present invention, but one of ordinary skill in the art may recognize that many further combinations and permutations of the present invention are possible. Accordingly, the present invention is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the invention. In this regard, it will also be recognized that the invention includes a system as well as a computer-readable medium having computer-executable instructions for performing the acts and/or events of the various methods of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

What is claimed is:

1. A switching system that employs inductive current steering, comprising:
 at least two elements whose respective secondary windings generate inductive currents in connection with applying a differential signal across the at least two elements;
 a steering component that directs the inductive currents to a switching component; and
 a differential component associated with the switching component that employs the inductive currents to generate a differential output.

2. The system of claim 1, the at least two elements are transformers.

3. The system of claim 1, respective primary windings of the at least two elements are powered by a differential clock bus.

4. The system of claim 1, the inductive currents are 180 degrees out-of-phase.

5. The system of claim 1, one of the inductive currents is utilized to turn "on" a first switch of the differential component and the other inductive current is utilized to turn "off" a second switch of the differential component.

6. The system of claim 1, a differential clock bus is utilized to toggle the state of a first switch and a second switch of the differential component.

7. The system of claim 1, the differential component comprises at least one differential transistor pair.

8. The system of claim 7, the differential transistor pair comprises at least two of an Indium Phosphide (InP), a carbon-doped InP, an Indium Gallium Arsenide (InGaAs), a GaAs, an Aluminum Gallium Arsenide (AlGaAs) heterojunction bipolar transistor (HBT), a Silicon-Germaniun, (SiGe) bipolar transistor (BJT) and Field Effect Transistor (FET).

9. The system of claim 1 is employed in one or more of a register, a flip-flop, a frequency divider, a memory module, a latch, a multiplexer, an oscillator, a power amplifier, an RF integrated circuit, and an ASIC.

10. The system of claim 1, the differential output is employed to drive a logic gate.

11. A switching system that utilizes inductive current steering, comprising:
- a current steering component that generates activating and deactivating signals by inducing current in a secondary winding when a primary winding is energized by a signal from a single clock bus; and
- a switching component that receives the activating and deactivating signals and generates a differential output based on the activating and deactivating signals.

12. The system of claim 11, the current steering component comprises a transformer.

13. The system of claim 11, the secondary winding is center-tapped, the center tap is coupled to a current source, and a first and a second end of the secondary winding provide the activating and deactivating signals to the switching component.

14. The system of claim 11, the activating and deactivating signals are 180 degrees out-of-phase.

15. The system of claim 11, the activating signal facilitates generating a high output and the deactivating signal facilitates generating an opposite polarity low output of the differential output.

16. The system of claim 11, the switching component comprises a differential transistor pair.

17. The system of claim 11 is employed in one or more of a register, a flip-flop, a frequency divider, a memory module, a latch, a multiplexer, an oscillator, a power amplifier, an RF integrated circuit, and an ASIC.

18. A data track and hold system that employs inductive current switching, comprising:
- at least two data latches; and
- a transformer based clock bus that controls the at least two data latches via inductive current, the transformer based clock bus comprises at least one transformer for each respective transistor of the at least two data latches, respective transformers provide inductive current to respective transistors, and the inductive current defines the state of the respective transistors.

19. The system of claim 18, respective data latches comprise a track differential transistor pair and a hold differential transistor pair.

20. The system of claim 18 is employed as a D-flip-flop.

21. A method for steering inductive current through one or more differential transistor pairs, comprising:
- transmitting a clock signal over one of a single clock bus or a differential clock bus;
- conveying the clock signal through one or more transformers to generate one or more inductive currents; and
- providing the one or more inductive currents to the one or more differential transistor pans.

22. The method of claim 21, the one or more inductive currents comprise at least two currents that are 180 degrees out of phase with respect to one another.

23. The method of claim 21, the one or more inductive currents can be toggled via the clock signal in order to toggle the state of the one or more differential transistor pairs.

24. A system that provides inductive current to a differential transistor pair, comprising:
- means far receiving one of a single or a differential clock signal;
- means for generating an inductive current based on the clock signal; and
- means for steering the inductive current through the differential transistor pair.

* * * * *